US006934197B2

(12) United States Patent
Han (10) Patent No.: US 6,934,197 B2
(45) Date of Patent: Aug. 23, 2005

(54) METHOD AND CIRCUIT CONFIGURATION FOR DIGITIZING A SIGNAL IN AN INPUT BUFFER OF A DRAM DEVICE

(75) Inventor: Jonghee Han, Cary, NC (US)

(73) Assignee: Infineon Technologies AG, Munich (DE)

( * ) Notice: Subject to any disclaimer, the term of this patent is extended or adjusted under 35 U.S.C. 154(b) by 94 days.

(21) Appl. No.: 10/683,768

(22) Filed: Oct. 10, 2003

(65) Prior Publication Data

US 2005/0078530 A1 Apr. 14, 2005

(51) Int. Cl.[7] .............................................. G11C 16/04
(52) U.S. Cl. ............. 365/189.05; 365/207; 365/189.09
(58) Field of Search ........................... 365/189.05, 207, 365/189.09, 242, 230.08

(56) References Cited

U.S. PATENT DOCUMENTS 6,424,577 B2 * 7/2002 Sim ...................... 365/189.05

* cited by examiner

Primary Examiner—David Lam
(74) Attorney, Agent, or Firm—Moser, Patterson & Sheridan, L.L.P.

(57) ABSTRACT

A method and circuit configuration for digitizing data and control signals using an input buffer in a dynamic random access memory (DRAM) device. In one embodiment, the input buffer includes buffer modules having a differential amplifier with a first input responsive to an input signal and a second input responsive to a reference voltage, a common source stage, and an output stage and a source of a bias voltage controlling impedance of the common source stage, wherein the reference voltage defines the amplitude of the bias voltage.

32 Claims, 6 Drawing Sheets

METHOD AND CIRCUIT CONFIGURATION FOR DIGITIZING A SIGNAL IN AN INPUT BUFFER OF A DRAM DEVICE

BACKGROUND OF THE INVENTION

1. Field of the Invention

The present invention generally relates to integrated circuit memory devices and, more particularly, to dynamic random access memory (DRAM) devices.

2. Description of the Related Art

The evolution of sub-micron CMOS technology has resulted in significant improvement in microprocessor speeds. Accordingly, there is an increasing demand for large dynamic random access memory (DRAM) devices with high density, speed and performance. In a DRAM device, each memory cell consists of one transistor and one capacitor. The cell has no amplification function and requires periodic refreshing to protect the data stored in the cell from corruption or decaying over time. Limitations on power consumption and small capacitances of cell capacitors result in low values of the signals available from memory cells. These signals are also subject to various noises that may make them unstable, while operation of DRAM devices requires reliable timing and detection of rising and falling edges of data and control signals.

In a DRAM device, data and control signals by are typically digitized before the signals are asserted by a respective receiving circuit of the device. Signal digitizing typically is performed using input buffers. An input buffer is generally a digitizing circuit that comprises a differential amplifier as in input stage and a Schmitt-type triggering circuit as an output stage. The differential amplifier conventionally has one input responsive to the signal being digitized and the other input responsive to a reference voltage. The reference voltage is generated within the DRAM device and may vary depending on loading conditions of digit lines, supply voltage, and the like. One illustrative example of the reference voltage is a pre-charge voltage used, in operation, to bias bit lines and complement bit line bars of the DRAM device. Instability of the reference voltage causes asymmetry in detection of rising and falling edges of the digitized data and control signals, as well as random elongation or truncation of the signals, and, as such, may degrade signal-to-noise ratio and operational performance of the DRAM device.

Therefore, there is a need in the art for an improved method and circuit configuration for digitizing data and control signals in an input buffer of a DRAM device.

SUMMARY OF THE INVENTION

A method of digitizing data and control signals in an input buffer of a dynamic random access memory (DRAM) device. The method comprises supplying a plurality of buffer modules, each buffer module including a differential amplifier having a first input and a second input, a common source stage, and an output stage, supplying a source of a bias voltage and a source of a reference voltage, coupling the first input to a source of a data or control signal and coupling the second input to a source of a reference voltage, applying the bias voltage to control impedance of the common source stage, and applying the reference voltage to define the amplitude of the bias voltage.

Another aspect of the invention is a circuit configuration of an input buffer of data or control signals in a DRAM device. The input buffer comprises a plurality of buffer modules, wherein each buffer module includes a differential amplifier having a first input responsive to the signal and a second input responsive to a reference voltage, a common source stage, and an output stage, and a source of a bias voltage. The bias voltage controls impedance of the common source stage, while the amplitude of the bias voltage is defined by the reference voltage.

Still another aspect of the invention is a control system of a DRAM device. The control system comprises a memory controller, a plurality of lines propagating data and/or control signals, and an input buffer. The input buffer is coupled to the plurality of the lines and comprises a plurality of input buffer modules for the data and/or control signals. Each input buffer module includes a differential amplifier having a first input responsive to a data or control signal and a second input responsive to a reference voltage, a common source stage, and an output stage and a source of a bias voltage. The bias voltage controls impedance of the common source stage, while the amplitude of the bias voltage is defined by the reference voltage.

Yet another aspect of the invention is a DRAM device comprising an array of DRAM memory cells, a memory controller, a source of an input signal, a source of a reference voltage, and at least one buffer module. The buffer module includes a differential amplifier having a first input responsive to the input signal and a second input responsive to the reference voltage, a common source stage, and an output stage, and a source of a bias voltage. The bias voltage controls impedance of the common source stage, while the amplitude of the bias voltage is defined by the reference voltage.

A further aspect of the invention is a method of digitizing a data or control signal in a DRAM device. The method comprises providing a buffer module including a differential amplifier having a first input and a second input, a common source gate stage, and an output stage, supplying a source of a bias voltage and a source of a reference voltage, coupling the first input to a source of the data or control signal and coupling the second input to a source of a reference voltage, applying the bias voltage to control impedance of the common source stage, and reducing dependence of an edge detection of the data or control signal from the reference voltage by applying the reference voltage to control the amplitude of the bias voltage.

Still a further aspect of the invention is a circuit configuration of an input buffer of a signal. The input buffer comprises a differential amplifier having a first input responsive to the signal and a second input responsive to a reference voltage, a common source stage connected between a common node and ground reference of the differential amplifier, an output stage coupled to an output of the differential amplifier, and a source of a bias voltage. The bias voltage controls impedance of the common source stage, while the amplitude of the bias voltage is defined by the reference voltage.

Yet a further aspect of the invention is a method of digitizing a signal. The method comprises providing an input buffer having a differential amplifier having a first input responsive to the signal and a second input responsive to a reference voltage, a common source stage connected between a common node and ground reference of the differential amplifier, and an output stage coupled to an output of the differential amplifier and a source of a bias voltage, applying the bias voltage to control impedance of the common source stage, and applying the reference voltage to define the amplitude of the bias voltage.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method and circuit configuration of an input buffer of data or control signals in a dynamic random access memory (DRAM) device.

Figure 1:
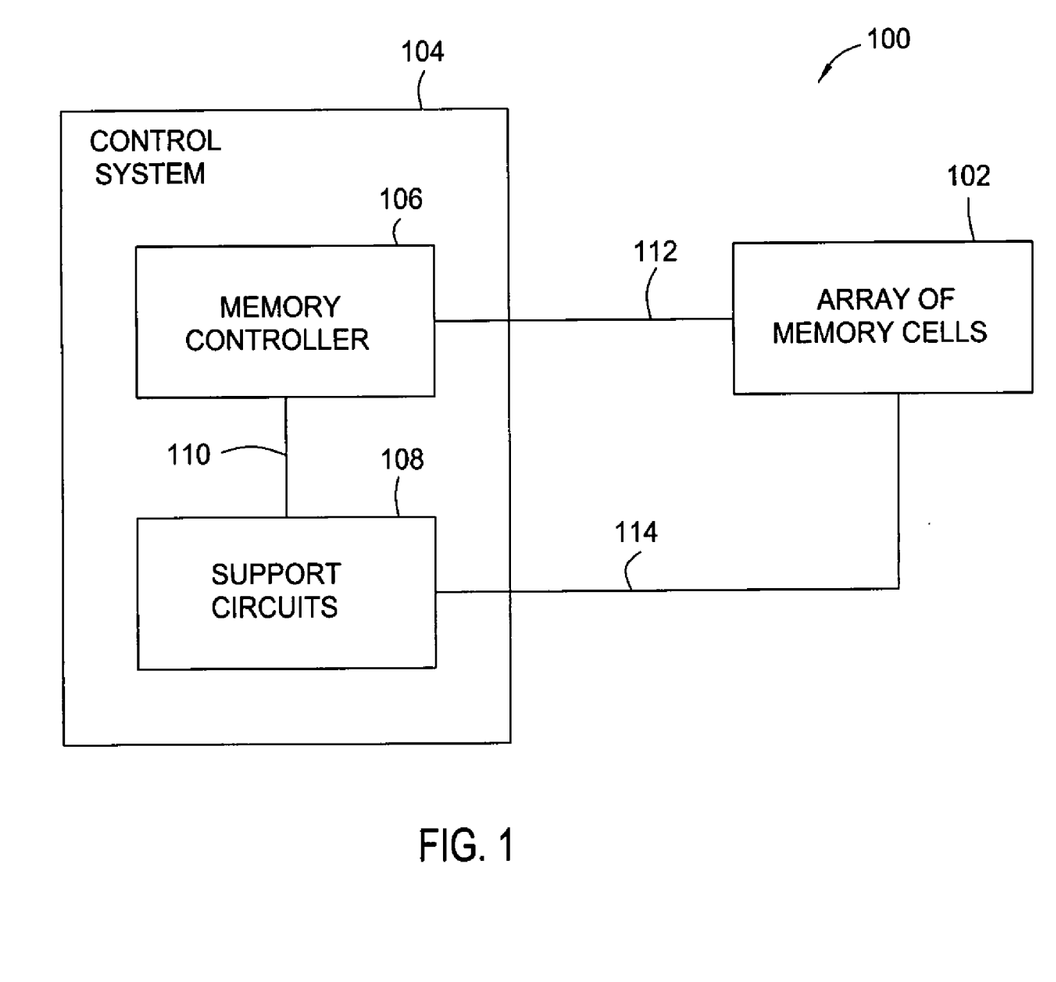
FIG. 1 depicts an exemplary diagram of a DRAM device.

FIG. 1 depicts an exemplary diagram of a DRAM device 100. The DRAM device 100 comprises an array 102 of memory cells and a control system 104. In one embodiment, the control system 104 includes a memory controller 106 and support circuits 108. The memory controller 106 facilitates execution of write, read, refresh, and other operations of the DRAM device 100. The support circuits 108 may comprise signal conditioning circuits, registers of data and commands, input/output circuits, power supplies, and the like. The array 102, memory controller 106, and support circuits 108 are interconnected using busses 110, 112 and 114. The busses 110, 112 and 114 are typically electrical interfaces comprising pluralities of bi-directional and uni-directional lines, which facilitate propagation of data, memory cell address information, and command and control signals within the DRAM device 100.

Figure 2:
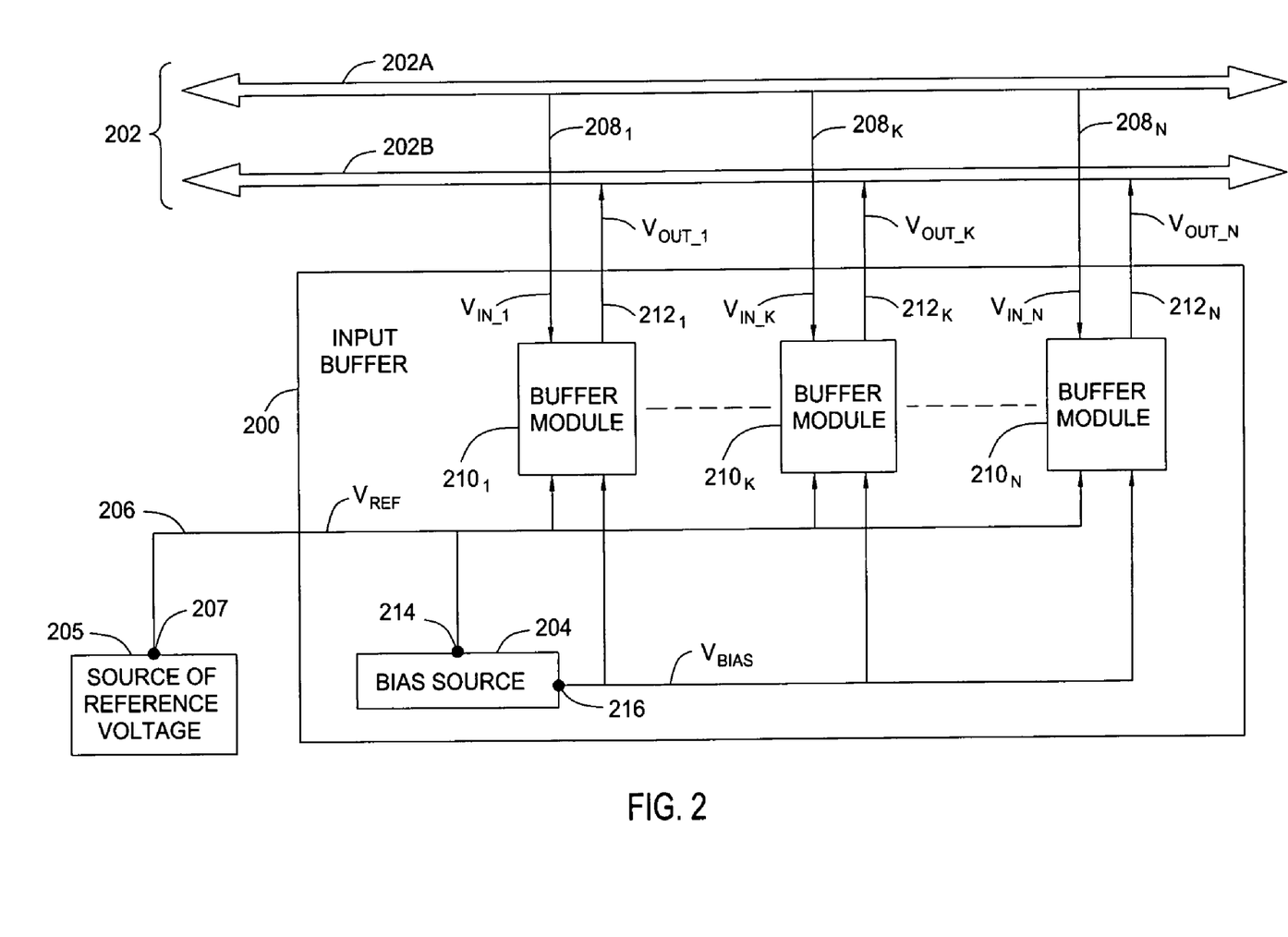
FIG. 2 depicts an exemplary diagram of a portion of a control system of the DRAM device of FIG. 1.

FIG. 2 depicts an exemplary diagram of a portion of the control system 104 comprising an input buffer 200, a source 205 of a reference voltage $V_{REF}$, a bus 202, and a line 206. The input buffer 200 comprises a plurality of buffer modules 210 and a source 204 of a bias voltage $V_{BIAS}$. In one embodiment, a number of the buffer modules 210 is equal to the maximum number N of input signals 208 to be digitized together (e.g., substantially simultaneously) in the input buffer 200. In FIG. 2, identical components and signals are identified using the same reference numeral, except that the suffix "K", where K is an integer from 1 to N, has been added to differentiate between such components and signals, respectively.

In one embodiment, the bus 202 illustratively includes a portion 202A and a portion 202B. The portion 202A comprises a plurality of lines $208_K$ propagating the input signals $V_{IN\_K}$ (e.g., data and/or control signals) to the input buffer 200. Accordingly, the portion 202B comprises a plurality of lines $212_K$ that propagate output signals $V_{OUT\_K}$ (i.e., digitized respective input signals $V_{IN\_K}$) of the input buffer 200. The line 206 is coupled to an output 207 of the source 205 of the reference voltage $V_{REF}$. In one embodiment, the input buffer 200 and bus 202 are elements of the support circuits 108 and bus 114, respectively, while the line 206 may be a portion of the bus 114 or bus 110.

In one embodiment, the bias source 204 is a source of controlled output voltage (i.e., bias voltage $V_{BIAS}$) such as, for example, a conventional controlled voltage-to-current converter or controlled voltage-to-voltage converter. The bias source 204 comprises an input 214 responsive to the reference voltage $V_{REF}$ and an output 216. The reference voltage $V_{REF}$ defines the amplitude of an output voltage (i.e., bias voltage $V_{BIAS}$) at the output 216, as well as controls operation of the buffer modules 210 (discussed below in reference to FIG. 3). In one embodiment, operation of the input buffer 200 and sources 205 and 207, as well as timing of signals on bus 202 and line 206 are synchronized by the memory controller 106.

Figure 3:
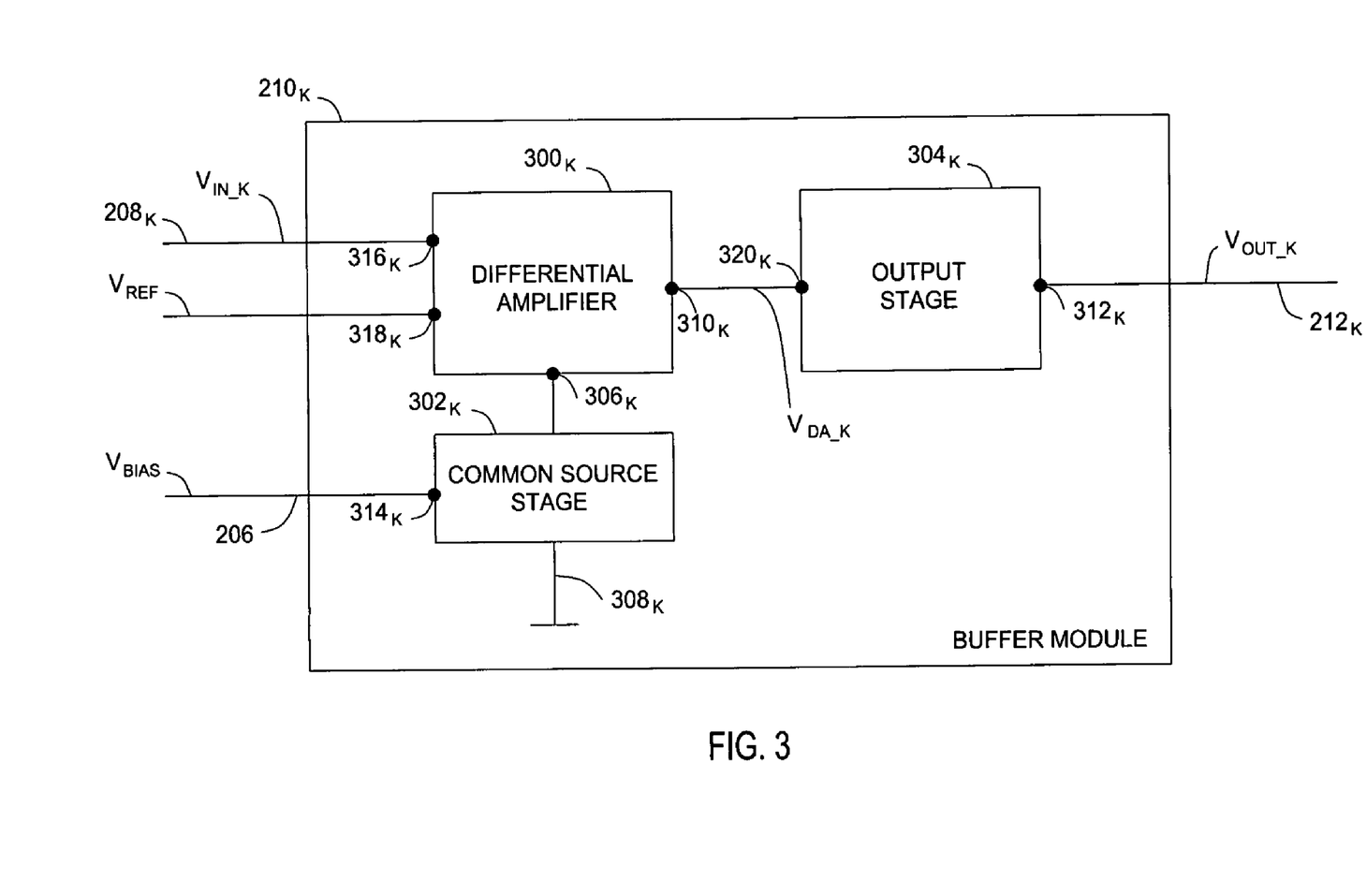
FIG. 3 depicts an exemplary circuit configuration for a buffer module of FIG. 2.

FIG. 3 depicts an exemplary diagram of the buffer module $210_K$. In one embodiment, the buffer module $210_K$ comprises a differential amplifier $300_K$, a common source stage $302_K$, and an output stage $304_K$. Inputs $316_K$ and $318_K$ of the differential amplifier $300_K$ are responsive to the input signal $V_{IN\_K}$ and reference voltage $V_{REF}$, respectively. The common source stage $302_K$ is connected between a common node $306_K$ of the differential amplifier $300_K$ and a ground reference $308_K$ of the buffer module $210_K$. Impedance of the common source stage $302_K$ may be controlled via an input $314_K$ that is responsive to the bias voltage $V_{BIAS}$, which in turn is defined by $V_{REF}$. Specifically, in one embodiment, impedance of the common source stage $302_K$ increases when the reference voltage $V_{REF}$ decreases and, oppositely, the impedance decreases when the reference voltage $V_{REF}$ increases. This control algorithm compensates for variations of the $V_{REF}$ and facilitates symmetry of timing and detecting rising and falling edges of the digitized signals. However, other control algorithms may be equally effective in achieving the same effect and, as such, use of another control algorithm or a plurality of control algorithms is within the scope of the present invention.

An input $320_K$ of the output stage $304_K$ is coupled to an output node $310_K$ of the differential amplifier $300_K$. In one embodiment, the output stage $304_K$ is a conventional Schmitt-type triggering circuit that digitizes an output signal of the differential amplifier $300_K$. More generally, the output stage $304_K$ may be any device that converts an output voltage $V_{DA\_K}$ of the differential amplifier $300_K$ to either a logic high level (i.e., logic "1") or a logic low level (i.e., logic "0"), as represented by the output signal $V_{OUT\_K}$ at an output node $312_K$ coupled to the line $212_K$.

Figure 4:
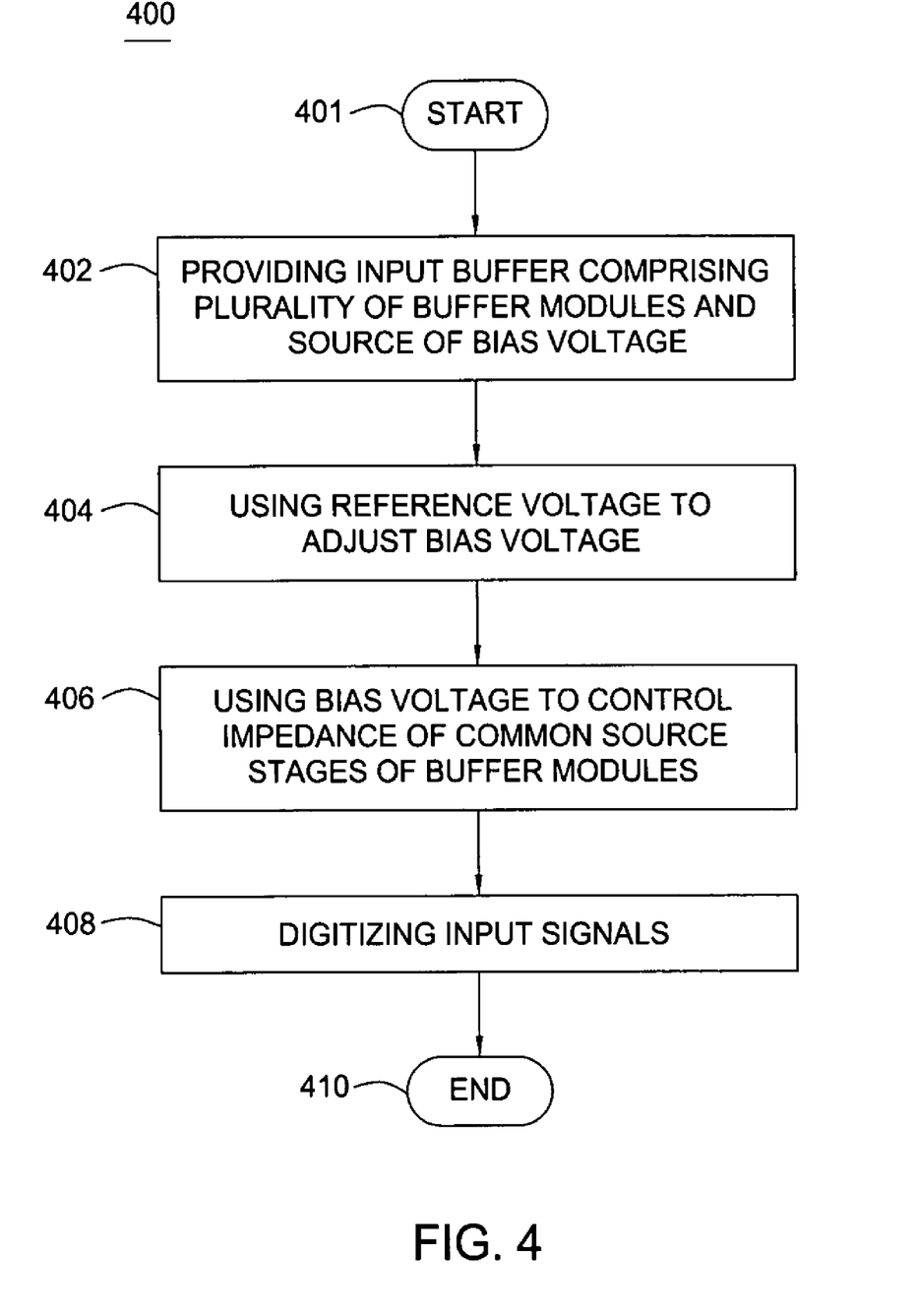
FIG. 4 depicts a flow diagram of a method for digitizing data and control signals in the input buffer of FIG. 2 in accordance with one embodiment of the present invention.

FIG. 4 depicts a flow diagram of the inventive method for digitizing data and/or control signals $V_{IN\_K}$ (i.e., input signals) in the input buffer 200 as a sequence 400. The sequence 400 includes the steps that are performed to digitize the input signals $V_{IN\_K}$. The sequence 400 starts at step 401 and proceeds to step 402 where the input buffer 200 comprising buffer modules $210_K$ and the source 204 of the bias voltage $V_{BIAS}$ is provided. At step 404, the amplitude of the bias voltage $V_{BIAS}$ may be adjusted in response to variations of the reference voltage $V_{REF}$. At step 406, the bias $V_{BIAS}$ is used to define impedance of the common source stages $302_K$ of the buffer modules $210_K$. At step 408, the input signals 208 are digitized. At step 410, the sequence 400 ends.

Figure 5:
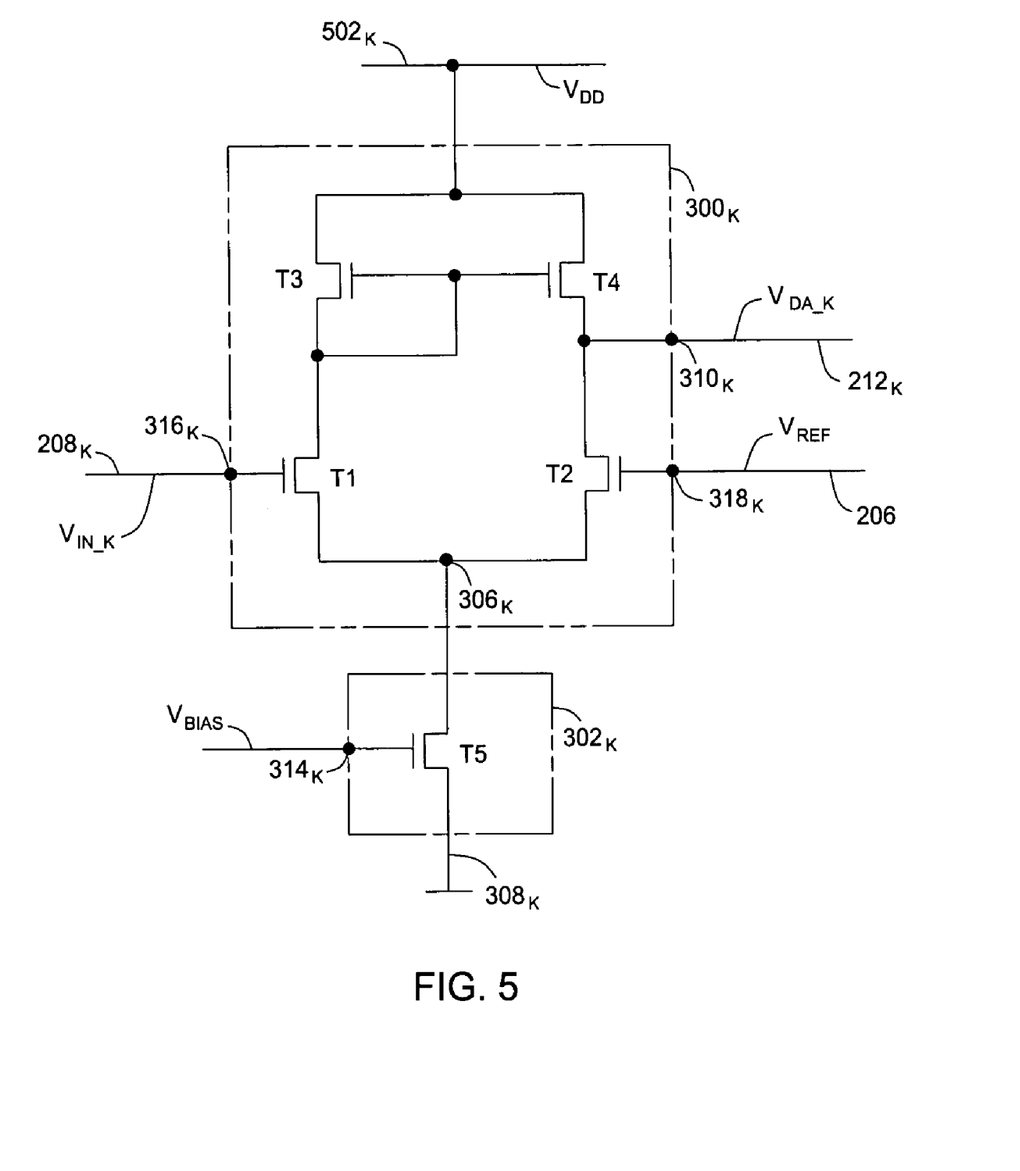
FIG. 5 depicts an exemplary circuit configuration of a differential amplifier and a common source stage of the buffer module of FIGS. 2 and 3.

FIG. 5 depicts an exemplary circuit configuration of the differential amplifier $300_K$ and common source stage $302_K$ of the buffer module $210_K$. In one illustrative embodiment, the differential amplifier $300_K$ comprises input transistors T1 and T2 and active load transistors T3 and T4, and the common source stage $302_K$ comprises a sink transistor T5. The active load transistors T3, T4 are coupled to a power line $502_K$ connected to a source (not shown) of supply voltage $V_{DD}$. The input signal $V_{IN\_K}$ and reference voltage $V_{REF}$ are provided to gate terminals of the input transistors T1 and T2, respectively. The input $314_K$ of the common source stage $302_K$ (i.e., gate terminal of the sink transistor T5) is coupled to the output 216 of the bias source 204 and controls impedance of the common source stage. In one exemplary embodiment, the reference voltage $V_{REF}$ controls the output voltage (i.e., bias voltage $V_{BIAS}$) of the bias source 204 in such a manner that the bias voltage $V_{BIAS}$ increases when the reference voltage $V_{REF}$ increases, and the bias voltage $V_{BIAS}$ decreases when the reference voltage $V_{REF}$ decreases, respectively. However, in alternate embodiments, other control algorithms may be used to adjust the bias voltage $V_{BIAS}$ in response to variations of the reference voltage $V_{REF}$, as discussed above in reference to FIG. 3.

Figure 6:
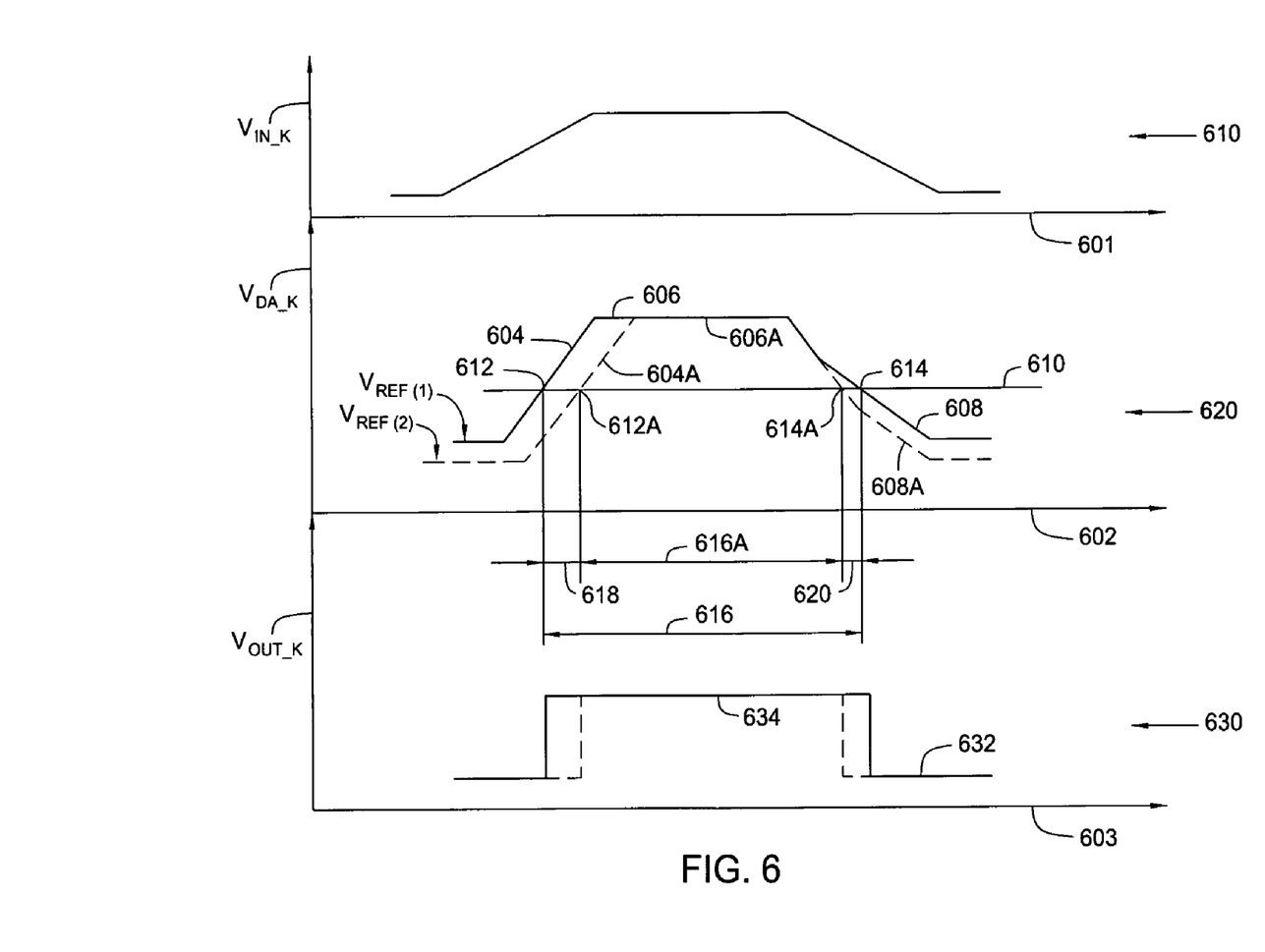
FIG. 6 depicts a series of illustrative timing diagrams of input and output voltages of the differential amplifier of FIG. 5 and output voltages of the buffer module of FIGS. 2 and 3.

FIG. 6 depicts a series of an illustrative timing diagram of the input signal $V_{IN\_K}$ and output voltage $V_{DA\_K}$ of the differential amplifier $300_K$ and the output signal $V_{OUT\_K}$ of the buffer module $210_K$. A graph 610 depicts the input signal $V_{IN\_K}$ versus time (x-axis 601). A graph 620 depicts the output voltage $V_{DAK}$ versus time (x-axis 602) for an exemplary value $V_{REF}(1)$ of the reference voltage $V_{REF}$. A graph 630 depicts the output signal $V_{OUT\_K}$ (i.e., digitized input signal $V_{IN\_K}$) versus time (x-axis 603). The output signal $V_{OUT\_K}$ may assert either a logic high level 634 or a logic low level 632. In graphs 620 and 630, the output voltage $V_{DA\_K}$ and output signal $V_{OUT\_K}$, respectively, at an exemplary value $V_{REF}(2)$ of the reference voltage $V_{REF}$, where $V_{REF}(2)$ is illustratively selected greater than $V_{REF}(1)$, are shown with broken lines and using the suffix "A" to designate similar respective phases.

The output voltage $V_{DA\_K}$ comprises a rising slope 604, a plateau 606, and a falling slope 608. A threshold voltage of the output stage $304_K$ (discussed in reference to FIG. 3) is shown as a level 610. Triggering points 612 and 614 define timing and a duration 616 of the digitized output signal $V_{OUT\_K}$ (shown with solid lines in graph 630) of the buffer module $210_K$. In graph 620, such triggering points are located at intersections of the slopes 604 and 608 with a line representing the threshold voltage (i.e., level 610) of the output stage $304_K$.

In operation, variations of the reference voltage $V_{REF}$ are compensated by the corresponding changes of the bias voltage $V_{BIAS}$, as discussed above in reference to FIG. 5. The output voltage $V_{DA\_K}$, as well as timing (i.e., triggering points 612, 614) and the duration 616 of the output signal $V_{OUT\_K}$ are insensitive to variations of the reference voltage $V_{REF}$ (e.g., pre-charge voltage, supply voltage, and the like). The inventive input buffer 200 facilitates repeatability and electrical symmetry of timing and detecting rising and falling edges of digitized data and control signals and, correspondingly, high operational performance of the DRAM device.

For comparison, the output voltage $V_{DA\_K}$ of the differential amplifier $208_K$ that does not have such a compensation for variations of the reference voltage $V_{REF}$ and the corresponding output signal $V_{OUT\_K}$ are depicted in graphs 620 and 630 using broken lines. In the depicted example, the reference voltage $V_{REF}$ has the value $V_{REF}(2)$ that is greater than the $V_{REF}(1)$. In this case, the output voltage $V_{DA\_K}$ comprises a rising slope 604A, a plateau 606A, and a falling slope 608A, and the digitized output signal $V_{OUT\_K}$ has triggering points 612A and 614A and a duration 616A which are located "inside" of the timing diagrams corresponding to $V_{REF}=V_{REF}(1)$. Specifically, timing of the triggering points for the rising and falling slopes 604A and 608A of the input signal $V_{IN\_K}$ are changed by durations 618 and 620, respectively, thus resulting in instability of timing and duration 616A of the output signal $V_{OUT\_K}$ and, as such, of the DRAM device. Similar instabilities of timing and duration of the output signal $V_{OUT\_K}$ take place when the value of the reference voltage $V_{REF}$ is less that $V_{REF}(1)$ and the triggering points are located "outside" of the timing diagrams corresponding to $V_{REF}=V_{REF}(1)$. Using the reference voltage $V_{REF}$ to control the amplitude of the bias voltage $V_{BIAS}$, as described above in reference to operation of the buffer module $210_K$, such instabilities of timing and duration of the output signal $V_{OUT\_K}$ may be compensated.

Although the foregoing discussion referred to the input buffer of a DRAM device, other electronic memory devices and input/output integrated circuits can benefit from the invention.

While the foregoing is directed to embodiments of the present invention, other and further embodiments of the invention may be devised without departing from the basic scope thereof, and the scope thereof is determined by the claims that follow.

What is claimed is:

1. A method of digitizing signals in an input buffer of a dynamic random access memory (DRAM) device, comprising:

providing a plurality of buffer modules, wherein each buffer module comprises a differential amplifier having a first input to receive a signal to be digitized and a second input to receive a reference voltage, a common source stage, and an output stage;

applying a bias voltage to control impedance of the common source stage; and applying the reference voltage to define the amplitude of the bias voltage.

2. The method of claim 1 wherein the common source stage is connected between a common node of the differential amplifier and a ground reference of the buffer module and comprises an input responsive to the bias voltage.

3. The method of claim 2 wherein the common source stage is a field effect transistor having a first terminal coupled to a common node of the differential amplifier, a second terminal coupled to a ground reference of the differential amplifier, and a gate terminal responsive to the bias voltage.

4. The method of claim 1 wherein an output of the differential amplifier is coupled to an input of the output stage.

5. The method of claim 1 wherein an output voltage of the output stage asserts one of a logic high level and a logic low level.

6. The method of claim 1 wherein the source of a bias voltage comprises one of a controlled voltage-to-current converter and a controlled voltage-to-voltage converter.

7. The method of claim 1 further comprising:

increasing the bias voltage when the reference voltage increases; and decreasing the bias voltage when the reference voltage decreases.

8. The method of claim 1 wherein timing and duration of the signal and the reference voltage are defined by a memory controller of the DRAM device.

9. A circuit configuration for an input buffer of signals in a dynamic random access memory (DRAM) device, comprising:
a plurality of buffer modules, wherein each buffer module comprises a differential amplifier having a first input responsive to a signal and a second input responsive to a reference voltage, a common source stage, and an output stage; and
a source of a bias voltage to control impedance of the common source stage, wherein the reference voltage defines the amplitude of the bias voltage.

10. The circuit configuration of claim 9 wherein the common source stage is connected between a common node of the differential amplifier and a ground reference of the buffer module and comprises an input responsive to the bias voltage.

11. The circuit configuration of claim 10 wherein the common source stage is a field effect transistor having a first terminal coupled to a common node of the differential amplifier, a second terminal coupled to a ground reference of the differential amplifier, and a gate terminal responsive to the bias voltage.

12. The circuit configuration of claim 11 wherein an output of the differential amplifier is coupled to an input of the output stage.

13. The circuit configuration of claim 9 wherein an output voltage of the output stage asserts one of a logic high level and a logic low level.

14. The circuit configuration of claim 9 wherein the source of a bias voltage comprises one of a controlled voltage-to-current converter and a controlled voltage-to-voltage converter.

15. The circuit configuration of claim 9 wherein the source of the bias voltage is configured to:
increase the bias voltage when the reference voltage increases; and
decrease the bias voltage when the reference voltage decreases.

16. The circuit configuration of claim 9 wherein timing and duration of the signals and the reference voltage are defined by a memory controller of the DRAM device.

17. A control system of a dynamic random access memory (DRAM) device, comprising:
a memory controller;
a plurality of lines propagating signals selected from at least one of data and control signals; and
an input buffer coupled to the plurality of the lines, the input buffer comprising:
a plurality of buffer modules for the signals, each buffer module comprising a differential amplifier having a first input responsive to an input signal selected from one of data and control signals and a second input responsive to a reference voltage, a common source stage, and an output stage; and
a source of a bias voltage to control impedance of the common source stage, wherein the amplitude of the bias voltage is controlled by the reference voltage.

18. The control system of claim 17 wherein the common source stage is a field effect transistor having a first terminal coupled to a common node of the differential amplifier, a second terminal coupled to a ground reference of the differential amplifier, and a gate terminal responsive to the bias voltage.

19. The control system of claim 17 wherein the source of the bias voltage is configured to:
increase the bias voltage when the reference voltage increases; and
decrease the bias voltage when the reference voltage decreases.

20. The control system of claim 17 wherein timing and duration of the at least one of data and control signals, the reference voltage, and the bias voltage are defined by the memory controller.

21. A dynamic random access memory (DRAM) device, comprising:
an array of DRAM memory cells;
a memory controller;
a source of signals selected from at least one of data and control signals;
a source of a reference voltage; and
at least one buffer module comprising:
a differential amplifier having a first input responsive to one of a data signal and a control signal and a second input responsive to the reference voltage, a common source stage, and an output stage; and
a source of a bias voltage to control impedance of the common source stage, wherein a reference voltage defines the amplitude of the bias voltage.

22. The DRAM device of claim 21 wherein the source of the bias voltage is configured to:
increase the bias voltage when the reference voltage increases; and
decrease the bias voltage when the reference voltage decreases.

23. The DRAM device of claim 21 wherein an output voltage of the output stage asserts one of a logic high level and a logic low level.

24. The DRAM device of claim 21 wherein timing and duration of the at least one of data and control signals, the reference voltage, and the bias voltage are defined by the memory controller.

25. A circuit configuration for an input buffer of a signal, comprising:
a differential amplifier having a first input responsive to the signal and a second input responsive to a reference voltage;
a common source stage connected between a common node and a ground reference of the differential amplifier;
an output stage coupled to an output of the differential amplifier; and
a source of a bias voltage to control impedance of the common source stage, wherein the reference voltage defines the amplitude of the bias voltage.

26. The circuit configuration of claim 25 wherein the common source stage is a field effect transistor having a first terminal coupled to the common node of the differential amplifier, a second terminal coupled to a ground reference of the differential amplifier, and a gate terminal responsive to the bias voltage.

27. The circuit configuration of claim 25 wherein the source of the bias voltage is configured to:
increase the bias voltage when the reference voltage increases; and
decrease the bias voltage when the reference voltage decreases.

28. The circuit configuration of claim 25 wherein an output voltage of the output stage asserts one of a logic high level and a logic low level.

29. A method of digitizing a signal, comprising:
providing an input buffer comprising:
- a differential amplifier having a first input responsive to the signal and a second input responsive to a reference voltage;
- a common source stage connected between a common node and a ground reference of the differential amplifier and comprising an input for a bias voltage; and
- an output stage coupled to an output of the differential amplifier; and controlling impedance of the common source stage in response to receiving the bias voltage on the input of the common source stage; and defining the amplitude of the bias voltage in response to receiving the reference voltage on the second input of the differential amplifier.

30. The method of claim 29 wherein the common source stage is a field effect transistor having a first terminal coupled to a common node of the differential amplifier, a second terminal coupled to a ground reference of the differential amplifier, and a gate terminal responsive to the bias voltage.

31. The method of claim 29 wherein the bias voltage is provided by a bias voltage source configured for:
- increasing the bias voltage when the reference voltage increases; and
- decreasing the bias voltage when the reference voltage decreases.

32. The method of claim 29 wherein an output voltage of the output stage asserts one of a logic high level and a logic low level.

* * * * *